United States Patent
Sahu et al.

(10) Patent No.: US 7,773,011 B2
(45) Date of Patent: Aug. 10, 2010

(54) SELF-TESTING DIGITAL-TO-ANALOG CONVERTER

(75) Inventors: Biranchinath Sahu, Bangalore (IN); Christopher Sanzo, Providence, RI (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/188,752

(22) Filed: Aug. 8, 2008

(65) Prior Publication Data
US 2010/0033358 A1  Feb. 11, 2010

(51) Int. Cl.
*H03M 1/10*  (2006.01)
(52) U.S. Cl. .................................. 341/120; 341/155
(58) Field of Classification Search .............. 341/144, 341/120, 118, 154
See application file for complete search history.

(56) References Cited

U.S. PATENT DOCUMENTS

| 6,445,325 B1 * | 9/2002 | Burns ......................... 341/144 |
| 2006/0247873 A1 * | 11/2006 | Fung et al. .................... 702/64 |
| 2009/0128382 A1 * | 5/2009 | Matsukawa et al. ......... 341/120 |

* cited by examiner

*Primary Examiner*—Peguy JeanPierre
(74) *Attorney, Agent, or Firm*—John J. Patti; Wade J. Brady, III; Frederick J. Telecky, Jr.

(57) ABSTRACT

One embodiment of the invention includes a digital-to-analog converter (DAC) circuit. The DAC circuit includes a DAC portion configured to generate an output voltage having a magnitude that varies based on a plurality of digital values of a digital input signal. The DAC circuit also includes a test portion configured to compare the output voltage with a predetermined test voltage for each of the plurality of digital values of the digital input signal during a test mode. The test portion can provide a digital output signal corresponding to one of acceptance and failure of the DAC circuit.

17 Claims, 2 Drawing Sheets

SELF-TESTING DIGITAL-TO-ANALOG CONVERTER

RELATED APPLICATIONS

This application claims priority to U.S. patent application Ser. No. 12/137,392, filed Jun. 11, 2008, which claims priority to U.S. Patent Application Ser. No. 60/943,327, filed Jun. 12, 2007. The subject matter of the aforementioned applications is incorporated herein by reference in their entirety.

TECHNICAL FIELD

This invention relates to electronic circuits, and more specifically to a self-testing digital-to-analog converter.

BACKGROUND

Digital-to-analog conversion is becoming an increasingly more important feature in many electronic devices. For example, wireless communications devices implement digital-to-analog conversion to convert digital data to an analog form for wireless transmission from an antenna. Thus, digital-to-analog converter (DAC) circuits have been developed to provide digital-to-analog conversion for any of a variety of electronic device applications. Because typical DAC circuits can include switches to provide the analog output voltage in response to the digital input signal, a typical DAC circuit can be tested after fabrication. For example, the magnitude of the analog output voltage of a typical DAC circuit can be measured for each digital value of the digital input signal to determine if the DAC circuit operates correctly.

SUMMARY

One embodiment of the invention includes a digital-to-analog converter (DAC) circuit. The DAC circuit includes a DAC portion configured to generate an output voltage having a magnitude that varies based on a plurality of digital values of a digital input signal. The DAC circuit also includes a test portion configured to compare the output voltage with a predetermined test voltage for each of the plurality of digital values of the digital input signal during a test mode. The test portion can provide a digital output signal corresponding to one of acceptance and failure of the DAC circuit.

Another embodiment of the invention includes a method for testing a DAC that converts a digital input signal into an output voltage. The method comprises asserting a test signal to initiate a test mode of the DAC and cycling through a plurality of values of the digital input signal and generating a test magnitude of the output voltage in response to each of the plurality of values of the digital input signal. The method also comprises comparing the output voltage with a predetermined test voltage during the test mode, and monitoring a digital output signal that is indicative of one of acceptance and failure of the DAC circuit during the test mode based on the comparison of the output voltage and the predetermined test voltage.

Another embodiment of the invention includes a DAC circuit. The DAC circuit includes means for dividing an input voltage at each of a plurality of nodes. The DAC circuit also includes means for coupling one of the plurality of nodes to an output based on a digital input signal to set a corresponding magnitude of an output voltage. The DAC circuit further includes means for comparing the output voltage with a predetermined test voltage during a test mode and for indicating one of acceptance and failure of the DAC circuit based on the comparison.

DETAILED DESCRIPTION

The invention relates to electronic circuits, and more specifically to a self-testing digital-to-analog converter (DAC). A DAC circuit can include a DAC portion and a test portion that can be integrated with the DAC portion. The DAC portion can be a resistive-ladder type of DAC, such that a switch can be activated for each state of a digital input signal to couple a respective voltage-divided node to an output to set a corresponding magnitude of an analog output voltage in an operation mode (i.e., normal operation of the DAC circuit).

The test portion can receive a test signal that initiates a test mode, during which the DAC portion can sequentially cycle through each digital input value. The test portion can thus compare a magnitude of the output voltage with a predetermined test voltage for each digital input value and can provide a digital output signal that indicates either acceptance or failure of the DAC circuit. Specifically, the digital output signal can indicate an open-circuit associated with any of the activated switches if the output voltage is less than the predetermined test voltage. In addition, the DAC portion can be deactivated, such that all of the switches are deactivated. Therefore, the test portion can indicate a short-circuit associated with any of the switches based on the output voltage being greater than the predetermined test voltage.

Figure 1:
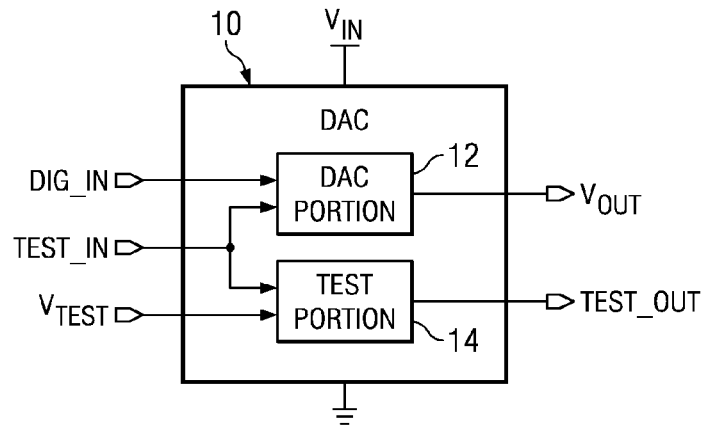
FIG. 1 illustrates a block diagram example of a digital-to-analog converter (DAC) in accordance with an aspect of the invention.

FIG. 1 illustrates a block diagram example of a digital-to-analog converter (DAC) 10 in accordance with an aspect of the invention. The DAC 10 can be implemented in any of a variety of electronic devices, such as in a transmitter for a wired or wireless communications device. In addition, the DAC 10 can be configured as an integrated circuit (IC). The DAC 10 is demonstrated in the example of FIG. 1 as being arranged between a positive rail voltage $V_{IN}$ and a negative rail voltage, demonstrated in the example of FIG. 1 as ground. As such, the DAC 10 receives power from the positive rail voltage $V_{IN}$.

The DAC 10 includes a DAC portion 12. The DAC portion 12 is a portion of the DAC 10 that provides digital-to-analog conversion of a digital input signal DIG_IN as an analog output voltage $V_{OUT}$. As an example, the DAC portion 12 can be configured as a resistive-ladder type of DAC. Therefore, the DAC portion 12 can include a plurality of switches that interconnect respective nodes between a set of series voltage-dividing resistors that interconnect the positive rail voltage $V_{IN}$ and ground. Thus, the switches can be individually closed based on the digital input signal DIG_IN to couple the output to a respective one of the nodes to set the magnitude of the output voltage $V_{OUT}$.

The DAC 10 also includes a test portion 14. The test portion 14 can be configured to test the DAC portion 12 to determine if it is either acceptable or a failure. Specifically, the test portion 14 is configured to determine the presence of open-circuits and/or short-circuits associated with one or more of the switches in the DAC portion 12 based on comparing the output voltage $V_{OUT}$ with a predetermined test voltage $V_{TEST}$.

In the example of FIG. 1, the DAC portion 12 and the test portion 14 each receive a test signal TEST_IN that can initiate a test mode for the DAC 10, such as after fabrication of the DAC 10. As an example, during the test mode, the DAC portion 12 can be commanded to cycle through each state of the digital input signal DIG_IN. Therefore, the test portion 14 can compare the output voltage $V_{OUT}$ with the predetermined test voltage $V_{TEST}$ for each value of the digital input signal DIG_IN. Accordingly, the test portion 14 can provide a digital output signal TEST_OUT that is indicative of failure of the DAC portion 12, such as resulting from a detected open-circuit and/or short-circuit based on the comparison of the output voltage $V_{OUT}$ and the predetermined test voltage $V_{TEST}$, or acceptance of the DAC portion 12.

The test portion 14 is thus configured to provide integrated self-testing of the DAC 10. As a result, significant cost and time savings can be realized based on the integrated self-testing. Specifically, instead of manually testing the magnitude of the output voltage $V_{OUT}$ for each value of the digital input signal DIG_IN to determine if the DAC 10 is an acceptable part, only the single digital output signal TEST_OUT need be monitored. Therefore, the DAC portion 12 can rapidly cycle through each value of the digital input signal DIG_IN without the need for measuring the output. As a result, testing time can be significantly shortened, resulting in a fabrication cost savings.

Figure 2:
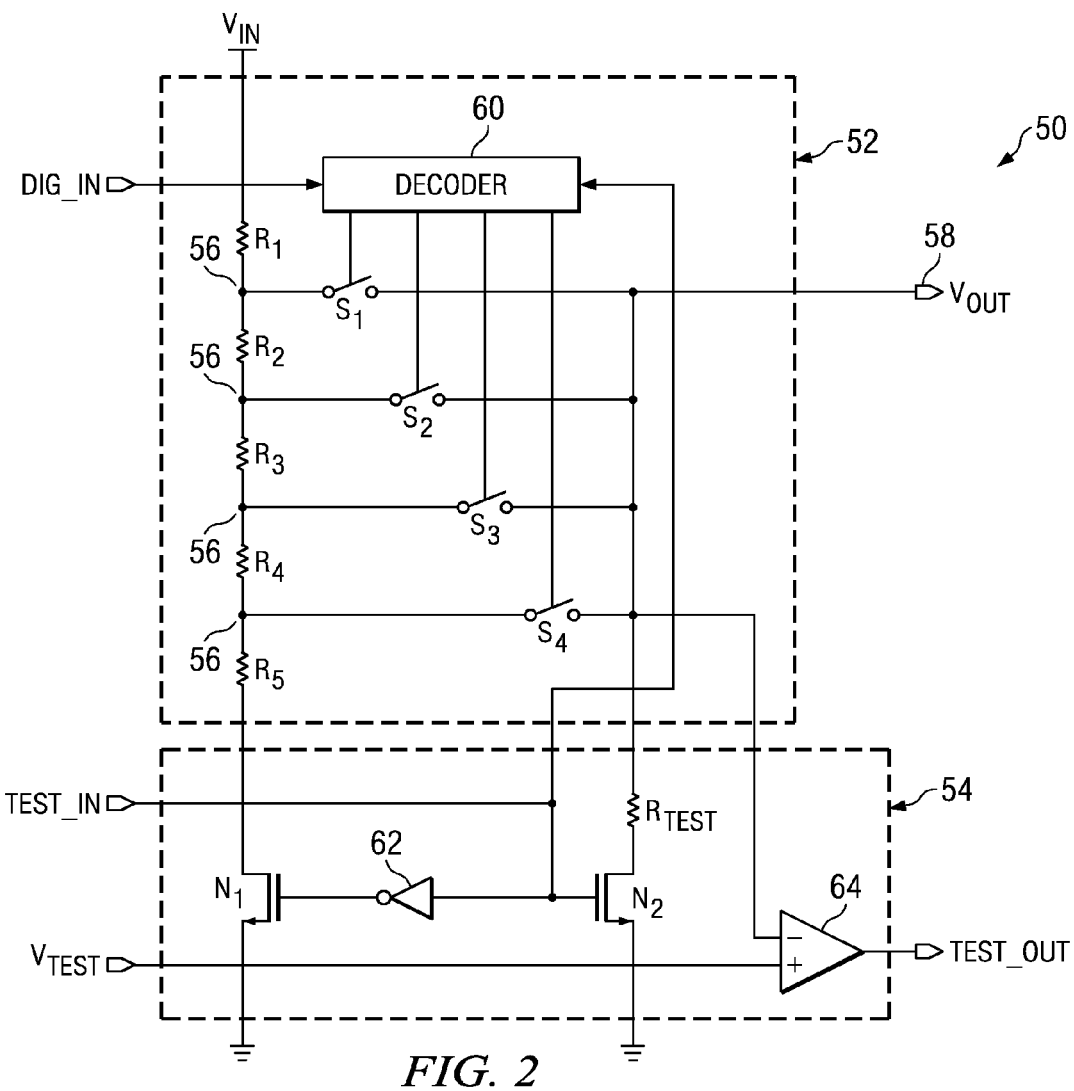
FIG. 2 illustrates an example of a digital-to-analog converter (DAC) circuit in accordance with an aspect of the invention.

FIG. 2 illustrates an example of a DAC circuit 50 in accordance with an aspect of the invention. The DAC circuit 50 can be implemented in any of a variety of electronic devices, such as in a transmitter for a wired or wireless communications device. In addition, the DAC circuit 50 can be configured as an IC. The DAC circuit 50 includes a DAC portion 52 and a test portion 54, similar to as described above regarding the DAC 10 in the example of FIG. 1.

The DAC portion 52 is configured in the example of FIG. 1 as a resistive-ladder type of DAC. Specifically, the DAC portion 52 includes a plurality of voltage-dividing resistors $R_1$ through $R_5$ arranged in series between a positive rail voltage $V_{IN}$ and ground. A node 56 occupies each junction between the resistors $R_1$ through $R_5$, such that each of the nodes 56 have a distinct voltage magnitude that is divided from the positive rail voltage $V_{IN}$. The DAC portion 52 also includes a plurality of switches $S_1$ through $S_4$. As an example, the switches $S_1$ through $S_4$ can each be configured as field-effect transistors (FETs). Each of the switches $S_1$ through $S_4$ interconnect a respective one of the nodes 56 with an output 58.

A digital input signal DIG_IN is provided to a decoder 60. The decoder 60 thus decodes the digital input signal DIG_IN to provide respective decode signals to the switches $S_1$ through $S_4$, such that the switches $S_1$ through $S_4$ are individually activated in response to the digital input signal DIG_IN. Therefore, upon activation, a respective one of the switches $S_1$ through $S_4$ couples the output 58 to a respective one of the nodes 56 to set a magnitude of an output voltage $V_{OUT}$ at the output 58, such as during an operation mode (i.e., normal operation of the DAC circuit 50). Accordingly, the output voltage $V_{OUT}$ is set to correspond to a given value of the digital input signal DIG_IN in the operation mode. It is to be understood that the DAC circuit 50 is not limited to five voltage-dividing resistors and four corresponding switches, but could include any number of voltage-dividing resistors and corresponding switches to provide the output voltage $V_{OUT}$ in response to any number of digital values of the digital input signal DIG_IN.

The test portion 54 includes a first N-FET $N_1$ having a drain coupled to the resistor $R_5$ and a source coupled to ground. The test portion 54 also includes a second N-FET $N_2$ having a drain that is coupled to the output voltage $V_{OUT}$ via a test resistor $R_{TEST}$ and a source that is coupled to ground. The first and second N-FETs $N_1$ and $N_2$ are mutually exclusively controlled by a test signal TEST_IN that is asserted to initiate a test mode. Specifically, upon the test signal TEST_IN being asserted, the DAC circuit 50 is switched from an operation mode to the test mode. In response, the first N-FET $N_1$ is deactivated via an inverter 62 to prevent current flow from the positive rail voltage $V_{IN}$ through all of the series resistors $R_1$ through $R_5$ to ground. In addition, the second N-FET $N_2$ is activated to provide current flow from the positive rail voltage $V_{IN}$ through one or more of the series resistors $R_1$ through $R_5$ and through the test resistor $R_{TEST}$ to ground. Therefore, in the test phase, the output voltage $V_{OUT}$ has a test magnitude that is based on the resistance value of the test resistor $R_{TEST}$ relative to the one or more of the series resistors $R_1$ through $R_5$ with which the test resistor $R_{TEST}$ is coupled in series via the respective one of the switches $S_1$ through $S_4$.

The test portion 54 also includes a comparator 64 that receives the output voltage $V_{OUT}$ at an inverting input and a predetermined test voltage $V_{TEST}$ at a non-inverting input. During the test mode, the comparator 64 is thus configured to compare the output voltage $V_{OUT}$ with the predetermined test voltage $V_{TEST}$ and to generate a digital output signal TEST_OUT in response. The digital output signal TEST_OUT can therefore indicate acceptance or failure of the DAC circuit 50.

For example, in response to the test signal TEST_IN being asserted, the decoder 60 can be configured to cycle through each of the possible values of the digital input signal DIG_IN to individually activate each of the switches $S_1$ through $S_4$ in an activation sequence. The predetermined test voltage $V_{TEST}$ can be selected to have a magnitude that is between ground and the lowest possible test magnitude of the output voltage $V_{OUT}$ when any one of the switches $S_1$ through $S_4$ is activated. Therefore, the digital output signal TEST_OUT should remain logic-low while each of the switches $S_1$ through $S_4$ is activated. Upon an open-circuit associated with an activated one of the switches $S_1$ through $S_4$, such that the respective activated switch provides no current flow to the output 58, the predetermined test voltage $V_{TEST}$ will be greater than the output voltage $V_{OUT}$. Accordingly, the digital output signal TEST_OUT is switched to a logic-high state, indicating failure of the DAC circuit 50.

As another example, in response to the test signal TEST_IN being asserted, the decoder 60 could be configured to deactivate the DAC portion 52, such that all of the switches $S_1$ through $S_4$ are deactivated. As a result, the test magnitude of the output voltage $V_{OUT}$ should be approximately zero. Therefore, the digital output signal TEST_OUT should be logic-high while all of the switches $S_1$ through $S_4$ are deactivated. Upon a short-circuit associated with a deactivated one of the switches $S_1$ through $S_4$, such that the respective deactivated switch still conducts current to ground through the test resistor $R_{TEST}$, the output voltage $V_{OUT}$ will be greater than the predetermined test $V_{TEST}$. Accordingly, the digital output signal TEST_OUT is switched to a logic-low state, indicating failure of the DAC circuit 50.

It is to be understood that the DAC circuit 50 is not intended to be limited to the example of FIG. 2. For example, the DAC circuit 50 could include one or more logic gates that can receive the digital output signal TEST_OUT as an input. Thus, in response to a test selection signal that dictates whether the test mode is testing an open-circuit condition or a short-circuit condition, a common logic-state (i.e., logic-high or logic-low) can indicate both a short-circuit condition and an open-circuit condition, and thus a failure, of the DAC circuit 50. In addition, the DAC circuit 50 is not limited to being configured as a resistive-ladder type of DAC that includes the decoder 60. For example, the DAC circuit 50 could be configured without the decoder 60, such that the digital input signal DIG_IN controls the switches $S_1$ through $S_4$ directly, or could be configured as any of a variety of different types of DACs.

In addition, as described above, the decoder 60 can be configured to cycle through each possible value of the digital input signal DIG_IN in response to the test signal TEST_IN. Alternatively, additional test circuitry can be included to cycle through the values of the digital input signal DIG_IN at the input of the decoder 60 to sequentially activate the switches $S_1$ through $S_4$ during the test mode. Furthermore, as an additional example, the test portion 54 is not limited to the configuration demonstrated in the example of FIG. 2. For example, the test voltage could be selected to be greater than the largest possible value of the output voltage $V_{OUT}$ in the operation mode, such that the first and second N-FETs $N_1$ and $N_2$ can be obviated. Accordingly, the DAC circuit 50 can be configured in any of a variety of ways.

Figure 3:
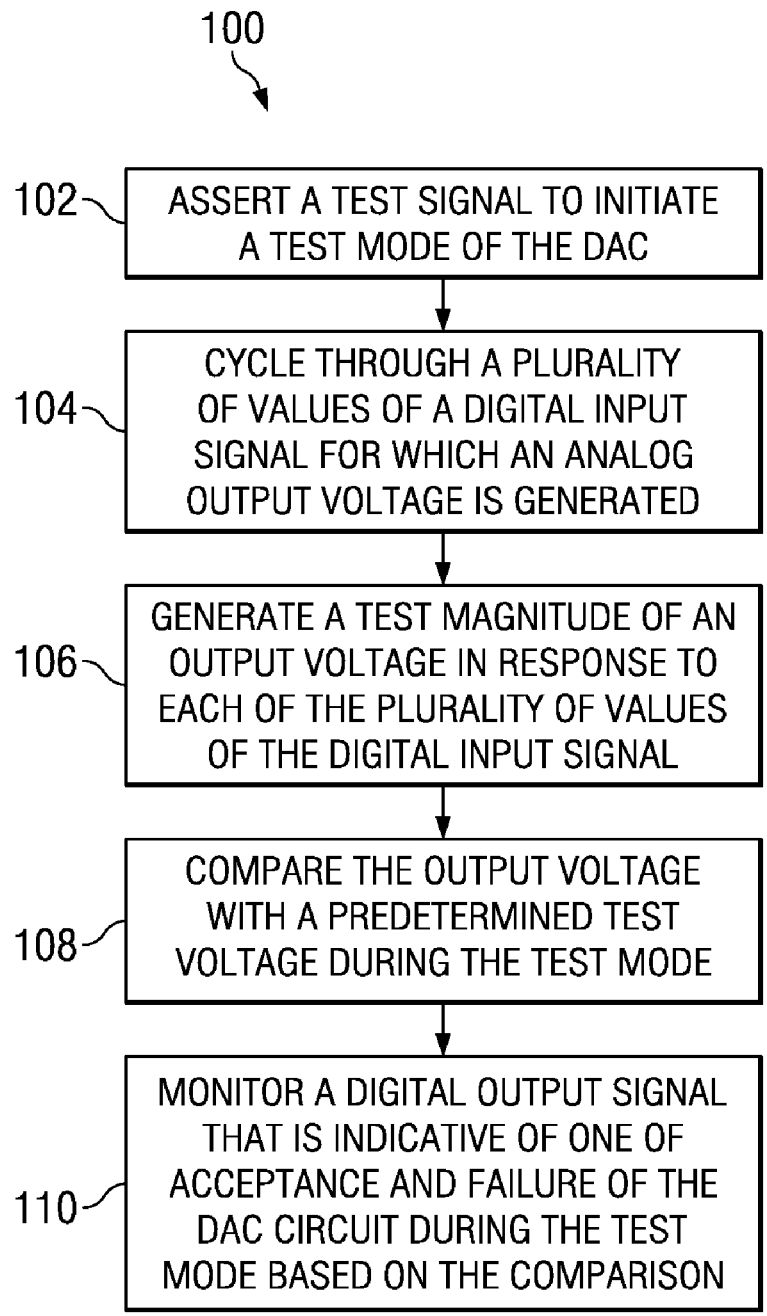
FIG. 3 illustrates an example of a method for testing a digital-to-analog converter (DAC) in accordance with an aspect of the invention.

In view of the foregoing structural and functional features described above, certain methods will be better appreciated with reference to FIG. 3. It is to be understood and appreciated that the illustrated actions, in other embodiments, may occur in different orders and/or concurrently with other actions. Moreover, not all illustrated features may be required to implement a method.

FIG. 3 illustrates an example of a method 100 for testing a DAC in accordance with an aspect of the invention. At 102, a test signal is asserted to initiate a test mode of the DAC. The test mode can be a mode for testing one of acceptance and failure of the DAC, such as after fabrication. At 104, a plurality of values of a digital input signal for which an analog output voltage is generated are cycled through. The DAC can include a decoder that cycles through the values of the digital input signal in response to the test signal, or additional test circuitry can cycle through the values of the digital input signal. The cycling of the values of the digital input signal can result in the closing of one or more switches to couple nodes with an output of the DAC.

At 106, a test magnitude of an output voltage is generated in response to each of the plurality of values of the digital input signal. The test magnitude of the output voltage can be less than a magnitude of the output voltage for the same corresponding digital input signal value in the operation mode. The test magnitude can be generated based on closing a switch to prevent current flow through a series connection of voltage-dividing resistors to ground and opening a switch to cause current flow through one or more of the series resistors through a test resistor to ground. At 108, the output voltage is compared with a predetermined test voltage during the test mode. The comparison can be via a comparator in an integrated test portion of the DAC. The predetermined test voltage can be selected to have a magnitude that is greater than ground but less than the lowest possible test magnitude of the output voltage. At 110, a digital output signal that is indicative of one of acceptance and failure of the DAC circuit is monitored during the test mode based on the comparison. If the digital output signal is logic-high while one of the switches of the DAC is activated, then the digital output signal can be indicative of an open-circuit condition. If the digital output signal is logic-low while all of the switches of the DAC are deactivated, then the digital output signal can be indicative of a short-circuit condition.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of the appended claims

What is claimed is:

1. A digital-to-analog converter (DAC) circuit comprising:
a DAC portion configured to generate an output voltage at an output that has a magnitude that varies based on different values of a digital input signal; and
a test portion configured to compare the output voltage with a predetermined test voltage for each of the plurality of digital values of the digital input signal during a test mode, wherein the test portion provides an output signal corresponding to one of acceptance and failure of the DAC circuit based on the comparison, and wherein the test mode is initiated by a test signal, and wherein the test portion includes a first transistor that is activated by a first state of the test signal to conduct current from the output through a test resistor to set a magnitude of the output voltage in the test mode that is greater than the predetermined test voltage for each of the plurality of values of the digital input signal for the DAC circuit to be accepted.

2. The DAC circuit of claim 1, wherein the test portion further comprises a comparator configured to compare a magnitude of the predetermined test voltage and a magnitude of the output voltage and to generate the digital output signal based on the comparison.

3. The DAC circuit of claim 1, wherein the test portion further comprises a second transistor that is activated by a second state of the test signal to conduct current from a plurality of voltage-dividing resistors to set the output voltage to correspond to the digital input signal in an operation mode of the DAC circuit.

4. The DAC circuit of claim 1, wherein the DAC portion further comprises:
a plurality of voltage-dividing resistors arranged in series between a positive voltage rail and a negative voltage rail; and
a plurality of switches that are activated in response to the digital input signal to couple the output to at least one of a respective plurality of interconnecting nodes associated with the plurality of voltage-dividing resistors to set a magnitude of the output voltage based on the digital input signal.

5. The DAC circuit of claim 4, wherein the DAC portion further comprises a decoder configured to decode the digital input signal and to provide a decoded output that activates one of the plurality of switches in response to each of the plurality of values of the digital input signal.

6. The DAC circuit of claim 5, wherein the decoder is further configured to step through each of the plurality of values of the digital input signal to respectively activate each of the plurality of switches in an activation sequence in response to a test signal during the test mode.

7. The DAC circuit of claim 1, wherein the digital output signal indicates a short-circuit associated with the DAC portion during the test mode if the output voltage has a magnitude that is greater than the predetermined test voltage upon the DAC portion being deactivated.

8. An integrated circuit comprising the DAC circuit of claim 1.

9. A DAC circuit comprising:
a DAC portion configured to generate an output voltage at an output that has a magnitude that varies based on different values of a digital input signal; and
a test portion configured to compare the output voltage with a predetermined test voltage for each of the plurality of digital values of the digital input signal during a test mode, wherein the test portion provides an output signal corresponding to one of acceptance and failure of the DAC circuit based on the comparison, and wherein the predetermined test voltage is selected to have a magnitude that is between a magnitude of a negative voltage rail and a test magnitude corresponds to the output voltage during the test mode, and wherein the digital output signal indicating an open-circuit associated with the DAC portion during the test mode if the output voltage has a magnitude that is less than the predetermined test voltage.

10. A method for testing a DAC that converts a digital input signal into an output voltage, the method comprising:
asserting a test signal to initiate a test mode of the DAC by:
activating a first transistor via a first state of the test signal to conduct a current through a test resistor to set the test magnitude of the output voltage in the test mode; and
deactivating a second transistor via a second state of the test signal to halt a current through a plurality of voltage-dividing resistors in an operation mode;
cycling through a plurality of values of the digital input signal by sequentially activating at least one of a plurality of switches for each of the plurality of different values of the digital input signal to couple an output to at least one of a respective plurality of interconnecting nodes associated with the plurality of series voltage-dividing resistors;
generating a test magnitude of the output voltage in response to each of the plurality of different values of the digital input signal;
comparing the output voltage with a predetermined test voltage during the test mode; and
monitoring a digital output signal that is indicative of one of acceptance and failure of the DAC circuit during the test mode based on the comparison of the output voltage and the predetermined test voltage.

11. The method of claim 10, wherein sequentially activating the at least one of the plurality of switches comprises individually activating each of the plurality of switches via a decoder in response to the test signal.

12. The method of claim 10, further comprising indicating an open-circuit associated with an activated one of the plurality of switches via the digital output signal during the test mode based on the output voltage having a magnitude that is less than the predetermined test voltage.

13. The method of claim 10, further comprising indicating a short-circuit associated with the plurality of switches via the digital output signal during the test mode based on the output voltage having a magnitude that is greater than the predetermined test voltage upon all of the plurality of switches being deactivated.

14. A DAC comprising:
a first portion that receives a digital input signal and a test signal and that outputs an analog output signal; and
a second portion having:
a test resistor that is coupled to the first portion;
a transistor having a first passive electrode, a second passive electrode, and a control electrode, wherein the control electrode of the transistor receives the test signal, and the first passive electrode of the transistor is coupled to the test resistor; and
a comparator that receives a test voltage and that is coupled to a test node between the test resistor and the first portion, wherein the comparator compares the voltage at the test node between the test resistor and the first portion with the test voltage.

15. The DAC of claim 14, wherein the first portion further comprises:
an output node that provides the analog output signal and that is coupled to the test resistor and the comparator;
a plurality of DAC resistors coupled in series with one another;
a plurality of switches, wherein each switch is coupled to the output node, and wherein each switch is coupled to a node between at least two of the plurality of DAC resistors; and
a decoder that receives the digital input signal, that receives the test signal, and that actuates the switches based at least in part on the digital input signal.

16. The DAC of claim 15, wherein the transistor further comprises a first transistor, and wherein the second portion further comprises:
an inverter that receives the test signal; and
a second transistor having a first passive electrode, a second passive electrode, and a control electrode, wherein the control electrode of the second transistor is coupled to the inverter, and the first passive electrode of the second transistor is coupled to at least one of the plurality of DAC resistors.

17. The DAC of claim 16, wherein the first and second transistors further comprise NMOS transistors.

* * * * *